United States Patent
Pawlik

(10) Patent No.: US 6,469,475 B2
(45) Date of Patent: Oct. 22, 2002

(54) METHOD AND APPARATUS FOR DETECTING A DISCONNECTION IN THE CHARGE LINE BETWEEN A GENERATOR AND AN ELECTRIC BATTERY IN A MOTOR VEHICLE

(75) Inventor: Peter Pawlik, Otterfing (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 09/818,544

(22) Filed: Mar. 28, 2001

(65) Prior Publication Data

US 2001/0043054 A1 Nov. 22, 2001

(30) Foreign Application Priority Data

May 4, 2000 (DE) .......................................... 100 21 602

(51) Int. Cl.[7] .............................. H02J 7/00; H02J 7/04; H02J 7/16
(52) U.S. Cl. ....................................... 320/134; 320/165
(58) Field of Search ................................. 320/134, 136, 320/165, DIG. 13

(56) References Cited

U.S. PATENT DOCUMENTS

| 4,242,674 A | 12/1980 | Wheeler |
| 4,459,548 A | 7/1984 | Lentz |

FOREIGN PATENT DOCUMENTS

| DE | 196 12 891 | 10/1997 |
| DE | 196 38 357 | 3/1998 |
| JP | 10304556 | 11/1998 |

OTHER PUBLICATIONS

Copy of the International Search Report.

*Primary Examiner*—Gregory J. Toatley, Jr.
(74) *Attorney, Agent, or Firm*—Crowell & Moring LLP

(57) ABSTRACT

In a method for detecting a disconnection in the charge line between a generator and an electric battery in a motor vehicle, the generator output voltage is measured and is evaluated at least with respect to the ripple voltage. A disconnection in the charge line is detected when the ripple voltage has reached or exceeded a predetermined ripple threshold value, preferably after the generator output voltage has reached or exceeded a predetermined load shedding threshold value.

16 Claims, 2 Drawing Sheets

METHOD AND APPARATUS FOR DETECTING A DISCONNECTION IN THE CHARGE LINE BETWEEN A GENERATOR AND AN ELECTRIC BATTERY IN A MOTOR VEHICLE

BACKGROUND AND SUMMARY OF THE INVENTION

This application claims the priority of German Application No. 100 21 602.1, filed May 4, 2000, the disclosure of which is expressly incorporated by reference herein.

The invention relates to a method and apparatus for detecting a disconnection in the charge line between a Regenerator and an electric battery in a motor vehicle.

Motor vehicles, in particular those with a 12 V electric system, are provided with energy by means of a regulated three phase generator. For an understanding of the technical background of electronic generator regulators, see in particular the technical manual "Autoelektrik, Autoelektronik am Ottomotor" [Automotive Electrics, Automotive Electronics at the Otto Engine], BOSCH, VDI Verlag, 1994. The trend today in the development of electronic generator regulators is toward independent intelligent controllers, predominantly with a data connection line to other controllers, such as the internal combustion engine controller. Compared to past generator regulators, this trend makes it possible to increase the range of functions in the generator regulator. For example, to avoid erratic torque changes when applying current to large electric loads, the output power of the generator is adjusted upward to a predetermined generator speed according to a defined ramp (so-called load response function, cf. German Patent document DE 196 36 357 A1). Furthermore, other diagnostic and error detecting routines are provided.

Currently, a disconnection or open circuit in the charge line from the generator to the battery, such as an intermittent contact due to a loose connection, cannot be undetected. Hence, the generator does not detect an error, but rather merely assumes that the electric system does not need any current. Consequently, the excitation is reduced to a minimum, or is totally turned off for a period of time. If, in the case of a loose connection, the connection, is re-established temporarily, the generator detects a load and begins to adjust upwardly the generator output, for example in accordance with the load response function (LRF). Continuous repetition of this sequence results in permanent insufficient output of the generator and, finally, to a depletion of the charge level of the motor vehicle's battery. This error situation can be reproduced only with difficulties in workshops and, therefore, leads to the unnecessary replacement of batteries and generators. The charge line from the generator output to the battery connection usually comprises a plurality of individual partial lines, assembled by means of plug connections or other connections. Therefore, the illustrated error is not rare.

The object of the invention is to improve error diagnosis in a generator regulator, in order to prevent unnecessary service and parts replacement costs.

This problem is solved by a process for detecting a disconnection in the charge line between a generator and an electric battery in a motor vehicle. The generator output voltage is measured and is evaluated at least with respect to the ripple voltage. A disconnection in the charge line is detected, when the ripple voltage has reached or exceeded a predetermined ripple threshold value. A device for carrying out the process for detecting a disconnection in the charge line between a generator and an electric battery in a motor vehicle includes a device, by which the generator output voltage is measured and is evaluated at least with respect to the ripple voltage, and a device, by which a disconnection in the charge line is detected, when the ripple voltage has reached or exceeded a predetermined ripple threshold value. Advantageous further developments of the invention are described herein.

According to the invention, a disconnection, for example in the form of a loose connection or in the form of a permanent disconnection, occurring in the charge line between a generator and an electric battery in a motor vehicle is detected when the ripple content of the generator output voltage or the ripple voltage has reached or exceeded preferably its mean value over a predetermined time span, a predetermined ripple threshold value, preferably after a predetermined or for a predetermined period of time (for example 2 ms). The ripple threshold (approx.>3 V or raised by a factor of 2) can-be predetermined as a fixed number or can vary as a function of the generator speed and/or the generator current. The ripple content or the ripple voltage is the voltage value between a maximum and a minimum of the remaining fluctuations in the generator output voltage after rectifying the output voltage, generated by a three phase generator.

The invention is based on the knowledge that the ripple voltage for an intact charge line between the generator and the battery is very small, since the fluctuations can be smoothed out by means of a battery, acting like a capacitor. The battery does not exert any smoothing effect when the charge line is disconnected.

Preferably, a disconnection in the charge line is detected when the ripple voltage reaches or exceeds a predetermined ripple threshold, after the generator output voltage has reached or exceeded a predetermined load shedding threshold value (for example, 18 V in a 12 V electric system). This further development of the invention is based on the knowledge that the transition from an intact to a disconnected charge line in accordance with a load shedding results first in a voltage overshoot. Correspondingly, the inventive evaluation of the ripple voltage with respect to a ripple threshold does not talk place until this voltage overshoot has occurred. In this respect it must be noted in terms of circuit engineering that even just very short voltage overshoots (for example, for 0.1 ms) are detected. In this manner the error detection accuracy is raised.

Furthermore, a disconnection in the charge line is not inferred preferably until an error in the output stage for driving the exciting coil has been ruled out. Because in the case of an error in this output stage, especially in a conductively alloyed output stage, the generator generates over voltages (for example, up to 20 V at a rated voltage of 12 V) and then delivers currents exceeding the rated power output, whereby a higher ripple voltage is also generated. Therefore, this condition must be considered in the invention in order to rule out imperfect error detection.

Furthermore, it is also preferred that a disconnection in the charge line in the presence of the aforementioned condition be detected only when the excitation in the exciting coil is less than 100%. This condition is based on the knowledge that in the case of a disconnection of the charge line from the view of the generator or the Regenerator regulator the same state prevails, at first, as in the case of no request-for current from the electric system with an intact charge line. This state can occur in the error-free case, if, for example, the battery is sufficiently charged and only a few loads are turned on. In this state the generator regulator switches the on period of the output stage of the exciting coils automatically to a minimum (so-called test pulse width).

Since the ripple content or the ripple voltage depends in particular on the generator speed and the current that is delivered, the ripple threshold, which is adapted preferably as a variable to these actuating variables, is predetermined. The simplest possible adaptation of this ripple threshold takes place by means of the following further development of the invention. Before the generator output voltage has reached or exceeded the predetermined load shedding threshold, a sliding mean value of the ripple voltage is preferably formed continuously. Then, even when the charge line is not intact, the result is a residual ripple, since the battery cannot smooth 100% the rectified three phase voltage of the generator. The respective ripple threshold value is then the momentarily applicable mean value of the ripple voltage at the time the generator output voltage reaches or exceeds the load shedding threshold value.

The process of the invention is integrated preferably as an expansion of the software into a generator regulator, which exists in any event, or into a generator controller, which exists in any event.

The invention enables a highly accurate, qualified error detection.

Other objects, advantages and novel features of the present invention will become apparent from the following detailed description of the invention when considered in conjunction with the accompanying drawings.

DETAILED DESCRIPTION OF THE DRAWINGS

Figure 1:
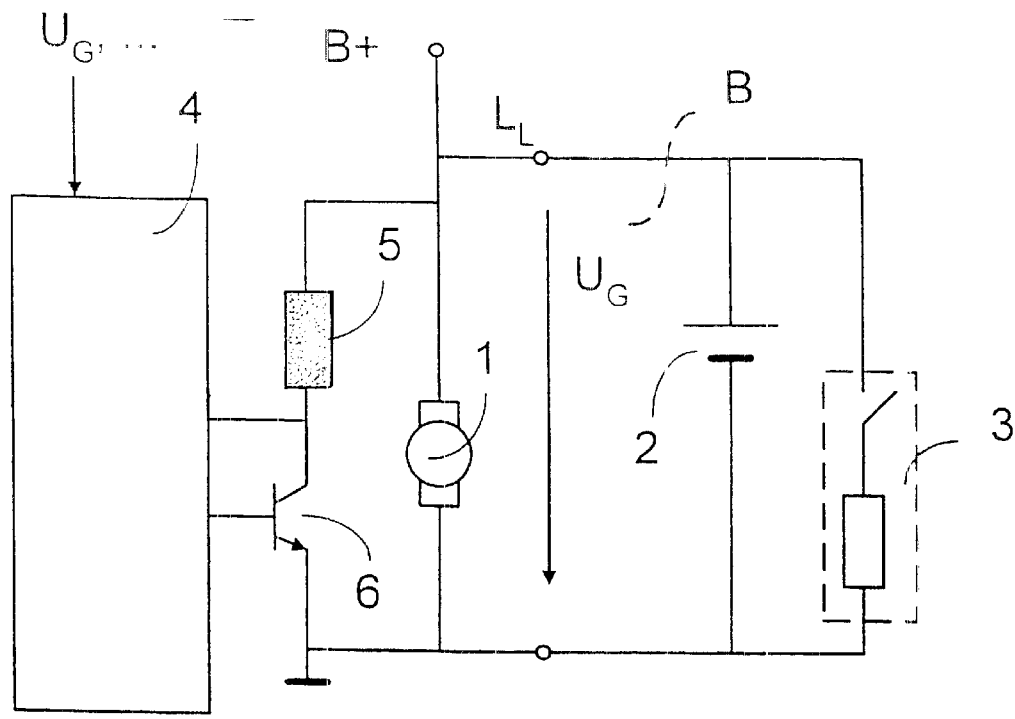
FIG. 1 is a circuit diagram illustrating the components of a generator, a generator regulator and an electric system that are essential for understanding the invention.

In FIG. 1, a battery 2 is connected in parallel with a generator 1. A charge line $L_L$ connects the generator output B+ to the plus terminal of the battery 2 of a motor vehicle (not shown). Depicted symbolically with a resistor 3 are the electric consumers of a motor vehicle that can be switched on and off. The generator 1 is assigned an intelligent generator regulator 4. The generator regulator 4 is connected at least by means of a control line to the base and by means of a feedback line to the collector of a transistor 6, hereinafter referred to in short as the output stage 6, for supplying current to the exciting coil 5. Furthermore, the generator regulator 4 receives at least the generator output voltage $U_G$ as an input signal. The inventive range of functions is integrated into the generator regulator 4 as software and is explained in connection with FIGS. 2 and 3.

Figure 2:
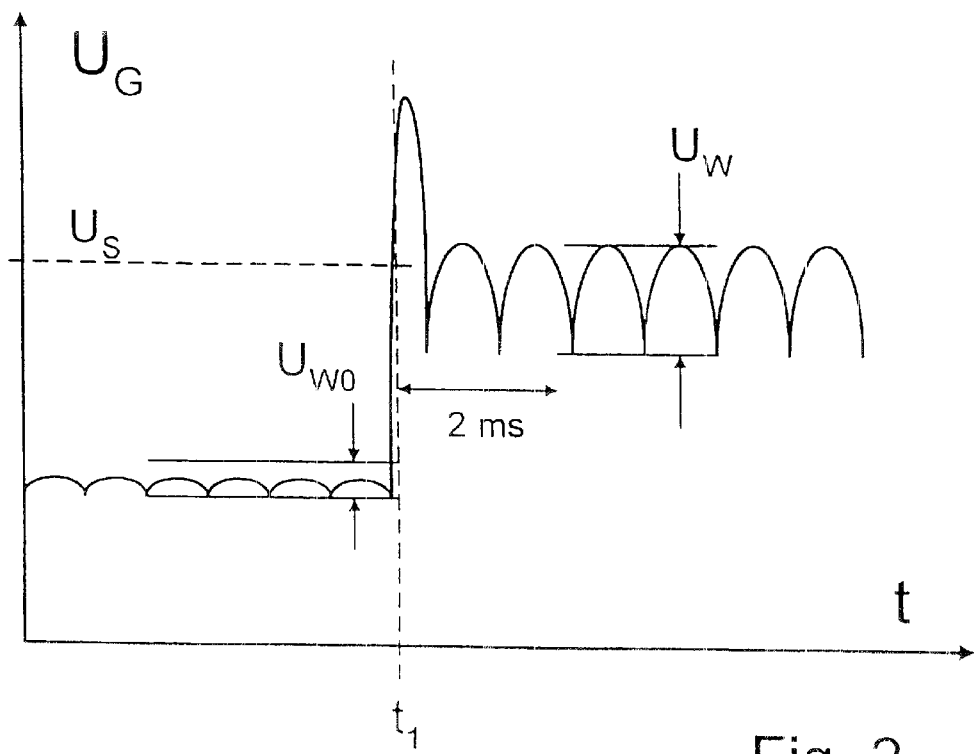
FIG. 2 depicts the curve of the generator output voltage before and after a disconnection in the charge line.

In FIG. 2, the generator output voltage U. is plotted over time t. First, the charge line $L_L$ is intact at the time t1. Prior to time t1, the absolute value of the generator output voltage $U_g$ is clearly below a defined load shedding threshold $U_S$, which can be, for example, 18 V in a 12 V electric system. The ripple voltage $U_W$ is very low. Prior to the time t1, a sliding mean value of the ripple voltage $U_W$ is formed continuously and, at the time t1, is taken over as the ripple threshold value $U_{W0}$. At the time t1, there occurs a prolonged disconnection B in the charge line $L_L$. Following the disconnection B, there is a voltage overshoot at time t1, by which the generator output voltage $U_G$ exceeds the load shedding threshold $U_S$. Thereupon there is an obvious increase in the ripple voltage $U_W$. Experience has shown that the ripple voltage $U_W$ exceeds the ripple threshold value $U_{W0}$ no later than after 2 ms.

The generator output voltage $U_G$ is detected in the generator regulator 4. The generator output voltage $U_G$ is further processed with respect to the detection of the ripple voltage $U_W$ and the determination of the sliding mean value of the ripple voltage $U_W$. Furthermore, a diagnosis of the output stage 6 takes place in the generator regulator 4, for example in accordance with the state of the art. The height of the excitation is determined, for example by means of the pulse duty factor of the control signal of the output stage 6. To compare the generator output voltage $U_G$ with the load shedding threshold Us, predetermined and stored in a memory, the generator regulator 4 has, for example, a threshold value comparator, which can also detect very short threshold shoots (for example, <0.1 ms).

Figure 3:
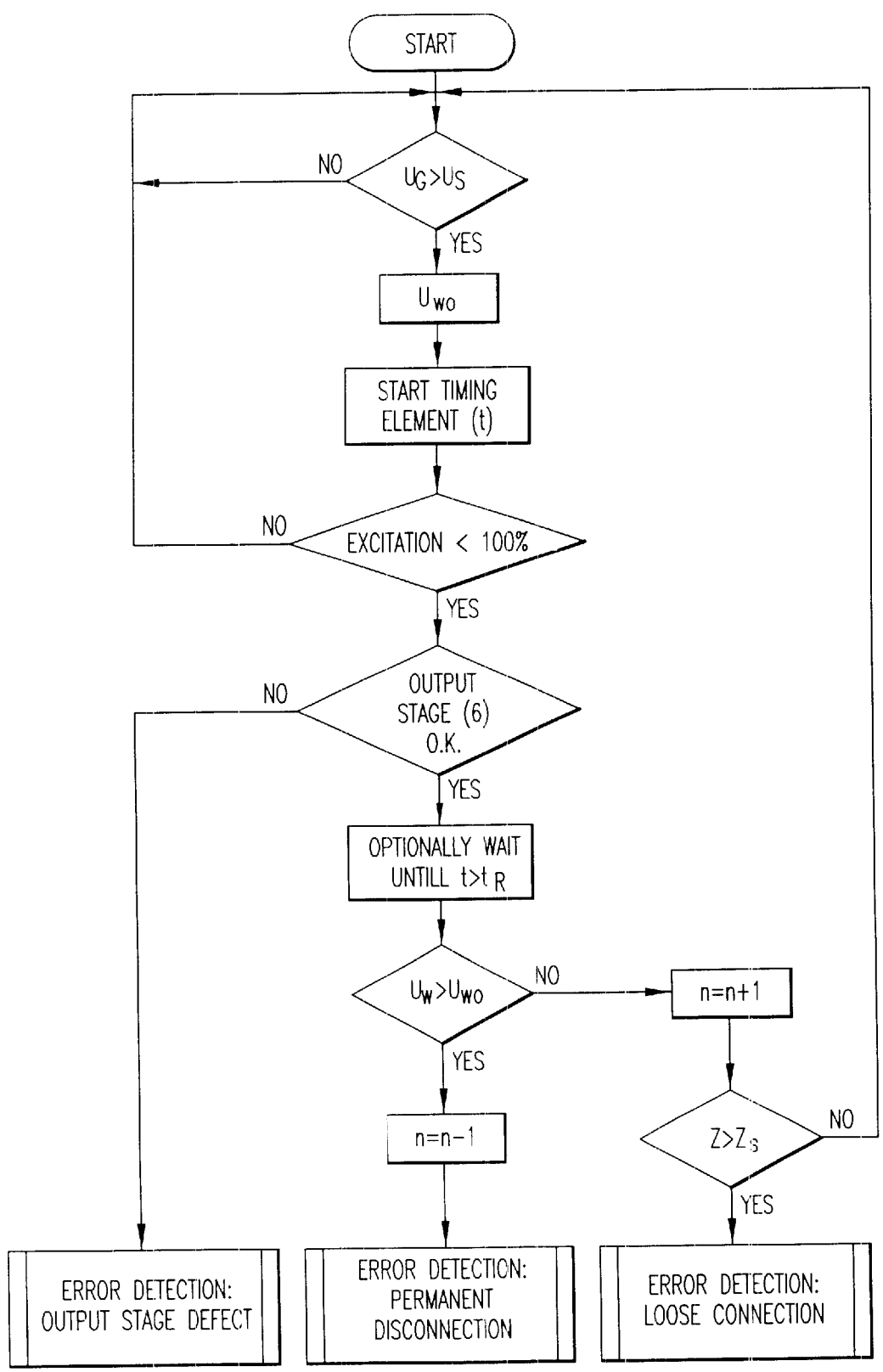
FIG. 3 is one embodiment of a flow chart of the process according to the invention.

The process, according to the invention, is described with reference to FIG. 3. First, the generator output voltage $U_G$ is compared with the load shedding threshold value $U_S$. When the generator output voltage $U_G$ exceeds the load shedding threshold value $U_S$, even for just a short period of time, the momentarily applicable sliding mean value of the ripple voltage $U_{W0}$ that is formed up to the time t1 is defined as the ripple threshold value and is stored. In the next step, a timing element for detecting the time t is started after time t1. Thereafter it is tested how high the excitation is. When the excitation is at least less than 100%, the result of the output stage diagnosis is polled. If the output stage 6 (cf. FIG. 1) is in order (o.k.), it is tested whether the time t, detected by means of the timing element, is greater than a predetermined time span $t_R$ (for example, 2 ms). The ripple voltage $U_W$ is compared with the ripple threshold value $U_{W0}$ no earlier than after passage of this predetermined time span $t_R$ after t1. For this comparison, the absolute value between the minimum and the maximum of each vibration or also a mean value of the ripple voltage $U_W$, formed for a short period of time, can be used.

When the ripple voltage $U_W$ has not exceeded the ripple threshold value $U_{W0}$, a counter is incremented (n=n+1). The count Z is compared with a defined limit $Z_S$ (for example, 5). If this limit $Z_S$ is exceeded, the generator regulator 4 infers a sporadic disconnection, that is, a loose connection, in the charge line $L_L$.

When the ripple voltage $U_W$ has exceeded the ripple threshold value $U_{W0}$, the counter is decremented (n=n−1) and the generator regulator 4 infers a permanent disconnection in the charge line $L_L$. The corresponding error detection can be stored in an error storage and retrieved in the repair shop.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:
1. A method for detecting a disconnection in a charge line between a generator and an electric battery in a motor vehicle, the method comprising the acts of:

measuring a generator output voltage in the motor vehicle and evaluating said measured output voltage at least with respect to a ripple voltage; and determining whether said ripple voltage reaches or exceeds a predetermined ripple threshold value to detect the disconnection in the charge line between the generator and the electric battery in the motor vehicle;

whereby depletion of a charge level in the electric battery of the motor vehicle can be prevented.

2. The method according to claim 1, further comprising the act of detecting the disconnection in the charge line when the ripple voltage reaches or exceeds the predetermined ripple threshold value after the generator output voltage reaches or exceeds a predetermined load shedding threshold value.

3. A method for detecting a disconnection in a charge line between a generator and an electric battery in a motor vehicle, the method comprising the acts of:

measuring a generator output voltage and evaluating said measured output voltage at least with respect to a ripple voltage; and determining whether said ripple voltage reaches or exceeds a predetermined ripple threshold value to detect the disconnection in the charge line;

further comprising the act of detecting the disconnection in the charge line when the ripple voltage reaches or exceeds the predetermined ripple threshold value after the generator output voltage reaches or exceeds a predetermined load shedding threshold value;

wherein the disconnection in the charge line is detected only when an error in an output stage for driving an excitation coil has been ruled out.

4. A method for detecting a disconnection in a charge line between a generator and an electric battery in a motor vehicle, the method comprising the acts of:

measuring a generator output voltage and evaluating said measured output voltage at least with respect to a ripple voltage; and determining whether said ripple voltage reaches or exceeds a predetermined ripple threshold value to detect the disconnection in the charge line;

further comprising the act of detecting the disconnection in the charge line when the ripple voltage reaches or exceeds the predetermined ripple threshold value after the generator output voltage reaches or exceeds a predetermined load shedding threshold value;

wherein the disconnection in the charge line is detected only when an excitation in an excitation coil is less than 100%.

5. The method according to claim 3, wherein the disconnection in the charge line is detected only when an excitation in the excitation coil is less than 100%.

6. A method for detecting a disconnection in a charge line between a generator and an electric battery in a motor vehicle, the method comprising the acts of:

measuring a generator output voltage and evaluating said measured output voltage at least with respect to a ripple voltage; and determining whether said ripple voltage reaches or exceeds a predetermined ripple threshold value to detect the disconnection in the charge line;

further comprising the act of detecting the disconnection in the charge line when the ripple voltage reaches or exceeds the predetermined ripple threshold value after the generator output voltage reaches or exceeds a predetermined load shedding threshold value;

further comprising the acts of:

forming a sliding mean value of the ripple voltage before the generator output voltage reaches or exceeds the predetermined load shedding threshold value;

equating the ripple threshold value to a momentarily applicable mean value of the ripple voltage at a time that the generator output voltage reaches or exceeds the load shedding threshold value.

7. The method according to claim 3, further comprising the acts of:

forming a sliding mean value of the ripple voltage before the generator output voltage reaches or exceeds the predetermined load shedding threshold value;

equating the ripple threshold value to a momentarily applicable mean value of the ripple voltage at a time that the generator output voltage reaches or exceeds the load shedding threshold value.

8. The method according to claim 4, further comprising the acts of:

forming a sliding mean value of the ripple voltage before the generator output voltage reaches or exceeds the predetermined load shedding threshold value;

equating the ripple threshold value to a momentarily applicable mean value of the ripple voltage at a time that the generator output voltage reaches or exceeds the load shedding threshold value.

9. An apparatus for detecting a disconnection in a charge line between a generator and an electric battery in a motor vehicle, the apparatus comprising:

means for measuring and evaluating a generator output voltage in the motor vehicle at least with respect to a ripple voltage; and means for determining when the ripple voltage reaches or exceeds a predetermined ripple threshold value so as to detect the disconnection in the charge line between the generator and the electric battery in the motor vehicle;

whereby depletion of a charge level in the electric battery of the motor vehicle can be prevented.

10. The apparatus according to claim 9, further comprising means for detecting the disconnection in the charge line when the ripple voltage reaches or exceeds a predetermined ripple threshold value after the generator output voltage reaches or exceeds a predetermined load shedding threshold value.

11. An apparatus for detecting a disconnection in a charge line between a generator and an electric battery in a motor vehicle, the apparatus comprising:

means for measuring and evaluating a generator output voltage at least with respect to a ripple voltage; and means for determining when the ripple voltage reaches or exceeds a predetermined ripple threshold value so as to detect the disconnection in the charge line;

further comprising means for detecting the disconnection in the charge line when the ripple voltage reaches or exceeds a predetermined ripple threshold value after the generator output voltage reaches or exceeds a predetermined load shedding threshold value;

further comprising means for detecting the disconnection in the charge line only when an error in an output stage that drives an excitation coil has been ruled out.

12. The apparatus according to claim 11, further comprising means for detecting the disconnection in the charge line only when an excitation in the excitation coil is less than 100%.

13. An apparatus for detecting a disconnection in a charge line between a generator and an electric battery in a motor vehicle, the apparatus comprising:

means for measuring and evaluating a generator output voltage at least with respect to a ripple voltage; and means for determining when the ripple voltage reaches or exceeds a predetermined ripple threshold value so as to detect the disconnection in the charge line;

further comprising:

means for forming a sliding mean value of the ripple voltage before the generator output voltage reaches or exceeds the predetermined load shedding threshold value; and means for equating the ripple threshold value to a momentarily applicable mean value of the ripple voltage at a time that the generator output voltage reaches or exceeds the load shedding threshold value.

14. An apparatus for detecting a disconnection in a charge line between a generator and an electric battery in a motor vehicle, the apparatus comprising:

means for measuring and evaluating a generator output voltage at least with respect to a ripple voltage; and means for determining when the ripple voltage reaches or exceeds a predetermined ripple threshold value so as to detect the disconnection in the charge line;

further comprising means for detecting the disconnection in the charge line when the ripple voltage reaches or exceeds a predetermined ripple threshold value after the generator output voltage reaches or exceeds a predetermined load shedding threshold value;

further comprising:

means for forming a sliding mean value of the ripple voltage before the generator output voltage reaches or exceeds the predetermined load shedding threshold value; and means for equating the ripple threshold value to a momentarily applicable mean value of the ripple voltage at a time that the generator output voltage reaches or exceeds the load shedding threshold value.

15. The apparatus according to claim 11, further comprising:

means for forming a sliding mean value of the ripple voltage before the generator output voltage reaches or exceeds the predetermined load shedding threshold value; and means for equating the ripple threshold value to a momentarily applicable mean value of the ripple voltage at a time that the generator output voltage reaches or exceeds the load shedding threshold value.

16. The apparatus according to claim 12, further comprising:

means for forming a sliding mean value of the ripple voltage before the generator output voltage reaches or exceeds the predetermined load shedding threshold value; and means for equating the ripple threshold value to a momentarily applicable mean value of the ripple voltage at a time that the generator output voltage reaches or exceeds the load shedding threshold value.

* * * * *